United States Patent [19]

Ishibashi et al.

[11] Patent Number: 5,229,915
[45] Date of Patent: Jul. 20, 1993

[54] POWER SEMICONDUCTOR DEVICE WITH HEAT DISSIPATING PROPERTY

[75] Inventors: Chihiro Ishibashi, Aichi; Hiroyuki Abe, Anjyo; Susumu Matsuoka, Nagoya, all of Japan

[73] Assignee: NGK Insulators, Ltd.

[21] Appl. No.: 928,665

[22] Filed: Aug. 17, 1992

Related U.S. Application Data

[63] Continuation of Ser. No. 645,567, Jan. 24, 1991, abandoned.

[30] Foreign Application Priority Data

Feb. 7, 1990 [JP] Japan ................................ 2-27357

[51] Int. Cl.$^5$ ............................................ H05K 7/20
[52] U.S. Cl. .................................. 361/385; 165/104.33; 174/15.2; 257/715
[58] Field of Search ................ 62/414, 418; 165/80.4, 165/80.5, 104.22, 104.33; 363/141; 174/15.2, 16.3; 361/382, 383, 385, 386, 388, 396; 257/715

[56] References Cited

U.S. PATENT DOCUMENTS

| | | | |
|---|---|---|---|
| 3,653,433 | 4/1972 | Schurli | 165/80.3 |
| 3,739,234 | 6/1973 | Bylund. | |
| 3,800,190 | 3/1974 | Marek | 165/80.3 |
| 3,852,805 | 12/1974 | Brzozowski | 357/82 |
| 3,996,604 | 12/1976 | Kimura | 357/82 |
| 4,028,723 | 6/1977 | Shikano et al. . | |
| 4,705,102 | 11/1987 | Kanda et al. . | |
| 4,899,211 | 2/1990 | Dumoulin | 357/82 |
| 4,982,274 | 1/1991 | Murase | 357/82 |
| 4,995,451 | 2/1991 | Hamburgen | 165/104.33 |

FOREIGN PATENT DOCUMENTS

| | | | |
|---|---|---|---|
| 2079196 | 11/1971 | France. | |
| 0108098 | 8/1981 | Japan | 165/104.33 |
| 0122152 | 9/1981 | Japan | 165/104.33 |
| 51318 | 10/1941 | Netherlands. | |

OTHER PUBLICATIONS

Patent Abstracts of Japan vol. 10, No. 125 (E-402) May 10, 1986 & JP-A-60 257, 142 (Hitachi Seisakusho KK) Dec. 18, 1985.
Patent Abstracts of Japan vol. 9, No. 147 (E-323) Jun. 21, 1985 & JP-A-60 028,254 (Shiyouwa Aruminiumu KK) Feb. 13, 1985.
Patent Abstracts of Japan vol. 10, No. 275 (E-438) Sep. 18, 1986 & JP-A-61 097,933 (Hitachi Ltd) May 16, 1986.
Patent Abstracts of Japan vol. 13, No. 561 (E-859) Dec. 13, 1989 & JP-A-1 233,747 (Mitsubishi Electric Corp) Sep. 19, 1989.
Patent Abstracts of Japan vol. 008, No. 081 (E-238) Apr. 13, 1984 & JP-A-59 004,032 (Tokyo Shibaura Denki KK) Jan. 10, 1984.
Patent Abstracts of Japan vol. 14, No. 163 (E-910) Mar. 29, 1990 & JP-A-2 020,048 (Fuji Electric Co Ltd) Jan. 23, 1990.

(List continued on next page.)

Primary Examiner—Gerald P. Tolin
Attorney, Agent, or Firm—Parkhurst, Wendel & Rossi

[57] ABSTRACT

A power semiconductor device such as power thyristor including a semiconductor substrate which is clamped by first and second conductive members serving as the electrodes as well as heat sinks, and a plurality of heat pipes whose ends are inserted directly into the conductive members. A plurality of semiconductor substrates and temperature compensating plates are alternatively stacked on another and conductive members are provided on outermost temperature compensating plates to form an assembly. The assembly is hermetically sealed by an insulating package formed by an insulator having a corrugated outer surface such that outer surfaces of the conductive members are exposed out of the package. One or more heat pipes are inserted into the insulating package such that electrically insulating cooling medium filled in the heat pipes can be in direct contact with the semiconductor substrates. The heat pipes may be inserted into the conductive members or heat sinks provided in the assembly.

11 Claims, 6 Drawing Sheets

OTHER PUBLICATIONS

Patent Abstracts of Japan vol. 11, No. 182 (E-515) Jun. 11, 1987 & JP-A-62 014,447 (Akutoronikusu KK) Jan. 23, 1987.

PT/Elektrotechniek Elektronica, vol. 41, No. 12, Dec. 1987, pp. 45-49, Rijswijk (Z-H), NL; M. C. van Der Walle: "Warmtepijpkoeling voor halfgeleidercomponenten".

Patent Abstracts of Japan, vol. 7, No. 154 (E-185) (1299), Jul. 6, 1983; & JP-A-58 63 153 (Fuji Kenki Seizo K.K.) Apr. 14, 1983.

Patent Abstracts of Japan, vol. 5, No. 174 (M-096), Nov. 10, 1981; & JP-A-56 100 292 (Oki Densen K.K.) Dec. 8, 1981.

FIG_1 *PRIOR ART*
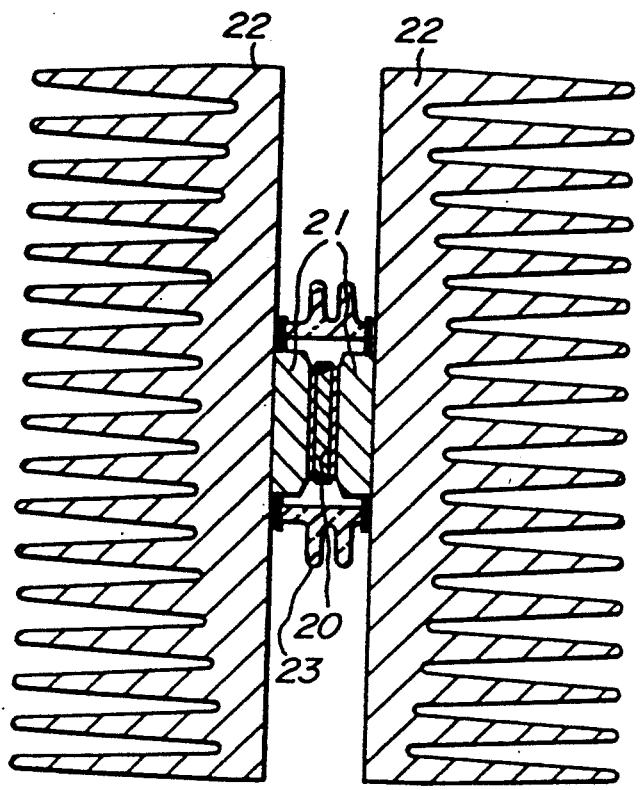
FIG_2 *PRIOR ART*
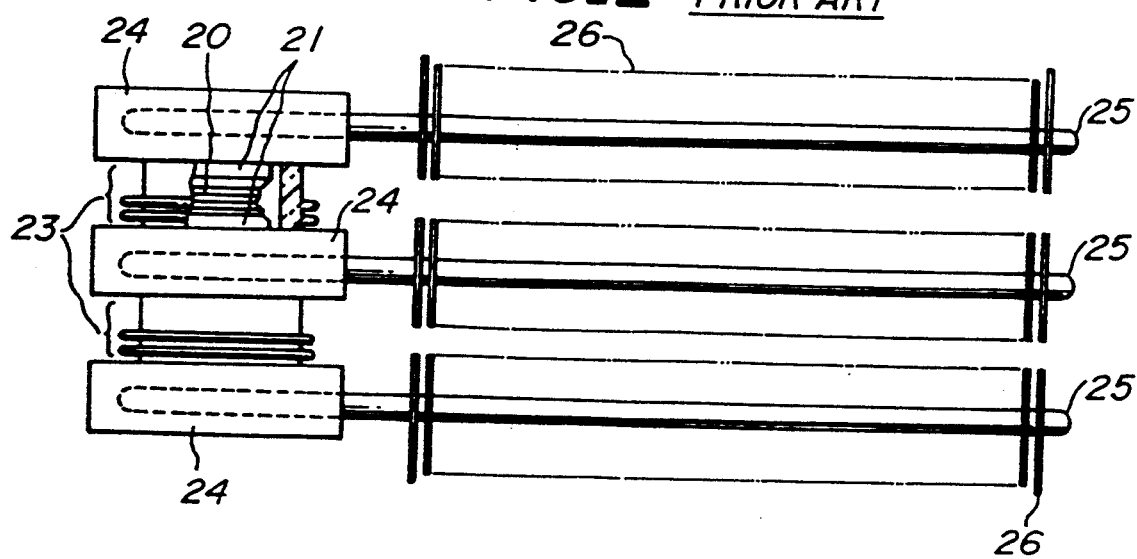

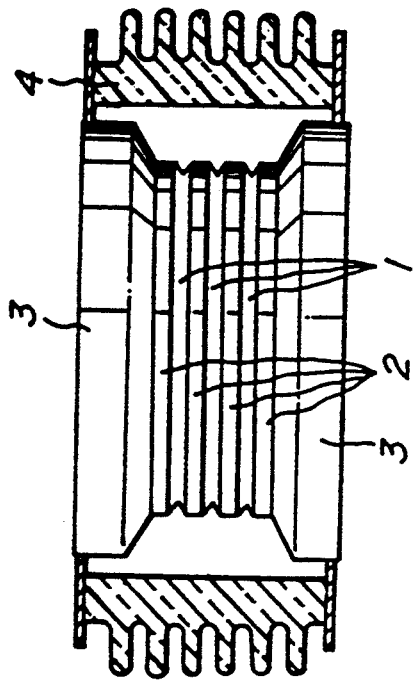
FIG._5
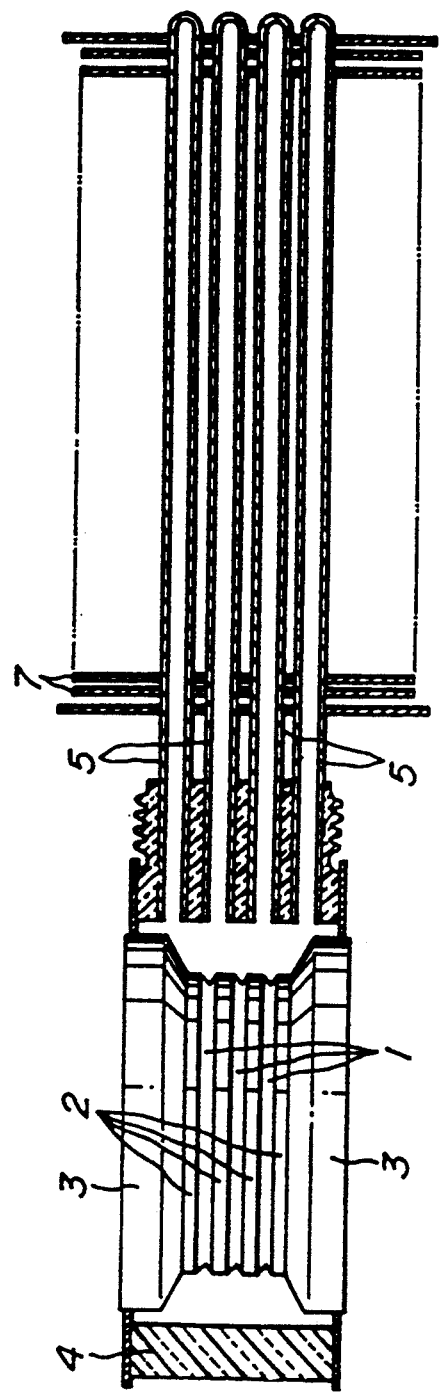
FIG._6

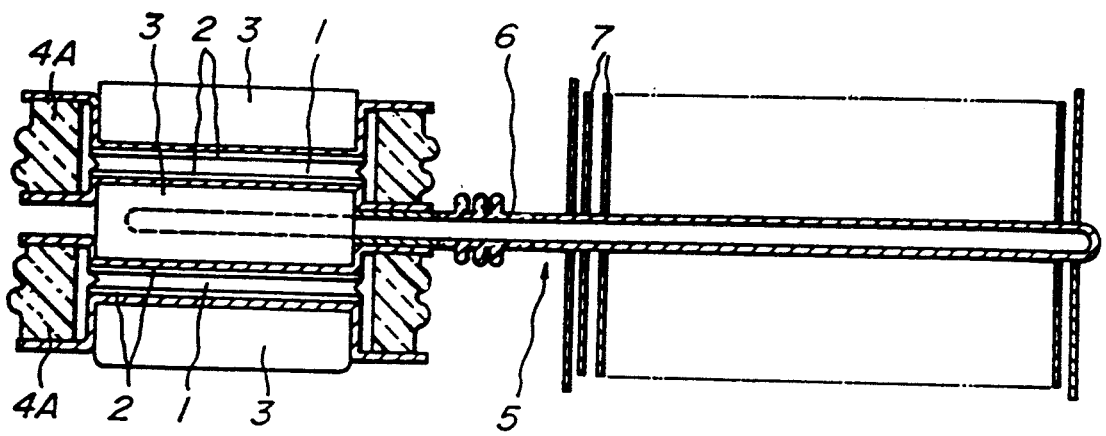
FIG_10
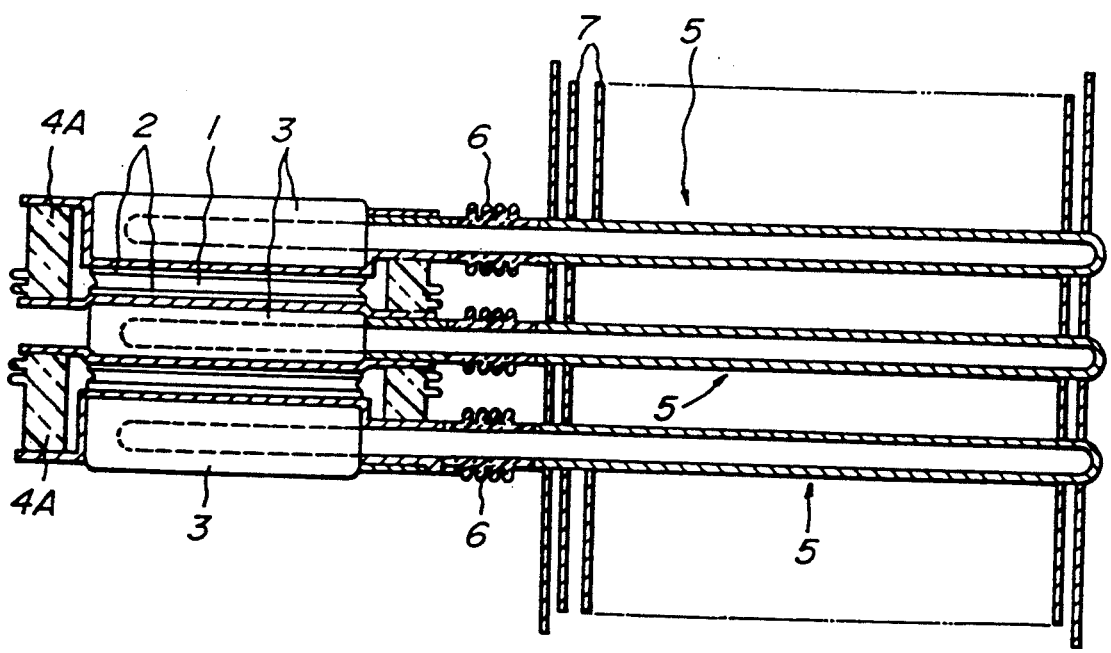
FIG_11

FIG_12
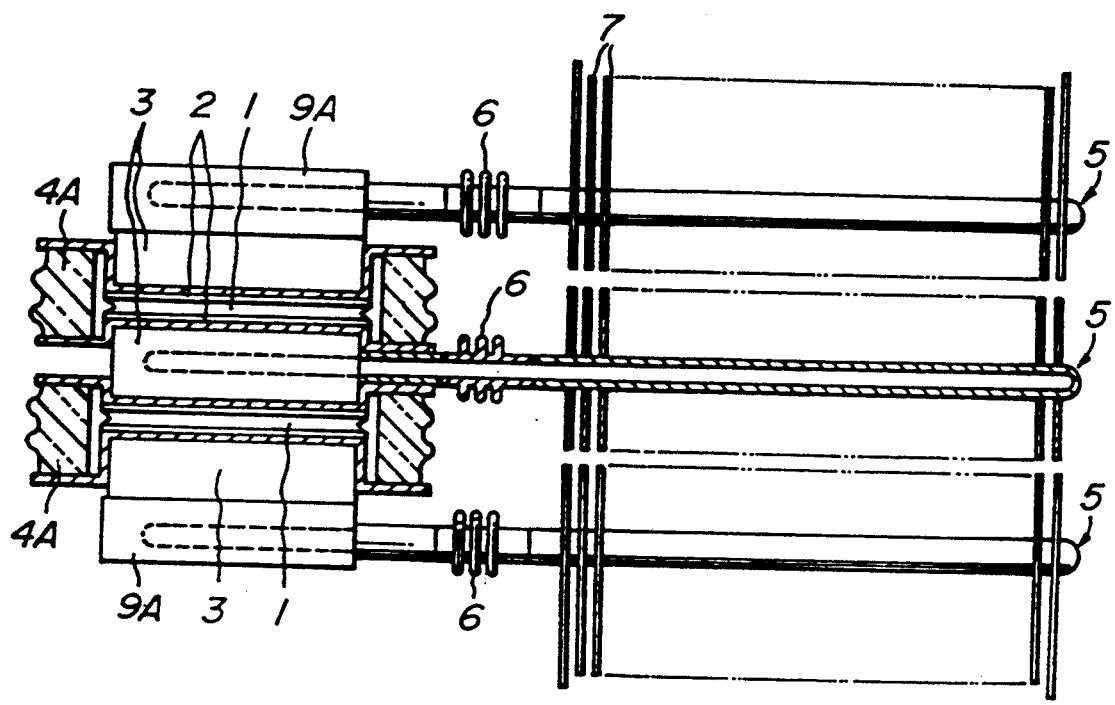
FIG_13
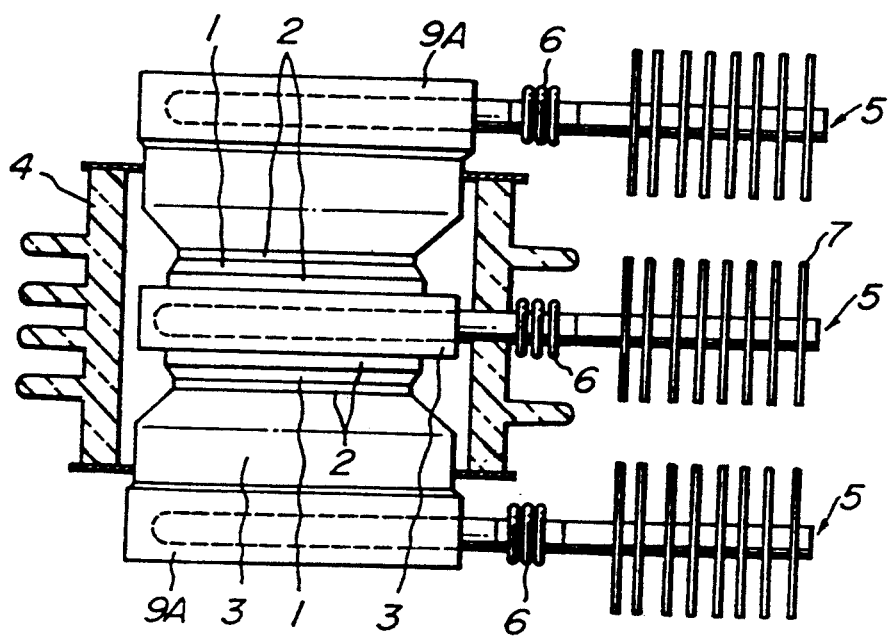

POWER SEMICONDUCTOR DEVICE WITH HEAT DISSIPATING PROPERTY

This is a continuation of application Ser. No. 07/645,567 filed Jan. 24, 1991, now abandoned.

BACKGROUND OF THE INVENTION

Field of the Invention and Related Art Statement

The present invention relates to a power semiconductor device an improved heat dissipating property and also relates to a power semiconductor device having a high breakdown voltage in addition to efficient heat dissipation.

When a large current flows through a large scale semiconductor device such as power thyristor, transistor and diode, a large amount of heat is generated from a semiconductor substrate. In order to dissipate the heat generated from the semiconductor substrate, it has been proposed to arrange electrically conductive members having a large dimension and being made of material having a high heat transmission such as copper on both sides of semiconductor substrate and cooling heat sinks are provided on outer surfaces of the conductive members.

FIG. 1 is a cross sectional view showing a known power semiconductor device, in which on both sides of a semiconductor substrate 20 are arranged electrically conductive members 21 and cooling fins 22 made of copper or aluminum are provided on outer surfaces of the conductive members, respectively. The conductive members are also serve as positive and negative electrodes. The assembly of the semiconductor substrate 20 and conductive members 21 is hermetically sealed by a package 23 made of insulating material such as ceramics. In order to improve the heat dissipating property, the cooling fins 22 have a very large size.

FIG. 2 is a side view illustrating another conventional power semiconductor device comprising the heat dissipating means. In this known power semiconductor device, on both sides of each of semiconductor substrates 20 of semiconductor elements are provided electrically conductive members 21 and each of assemblies of the substrate and conductive members is surrounded by a heat sink 24 made of copper. The semiconductor substrate 20 is hermetically sealed by an insulating package 23 provided between the heat sinks 24. Into each of the heat sinks 24 is inserted one end of a heat pipe 25 and a plurality of cooling fins 26 are provided on the heat pipe.

In the known power semiconductor device shown in FIG. 1, the heat generated by the semiconductor substrate 20 is first transmitted to the conductive members 21 and then is further transmitted to the cooling fins 22, and in the known semiconductor device illustrated in FIG. 2, the heat is transmitted to the heat sink 24 via the conductive members 21 and is transmitted therefrom to the cooling fins 26 by means of the heat pipe 25. It has been experimentally confirmed that there are substantial heat resistances between these components. Furthermore, the heat transmission path from the heat generating point to the heat dissipating point is relatively long. Due to the above mentioned reasons, in the known power semiconductor devices, in order to obtain the adequate heat dissipation, it is necessary to provide the heat sink having a very large surface area, so that the size of the whole device is liable to be large. Even if the large heat sink is used, the cooling ability is limited, and thus the current capacity of the semiconductor device is limited by the heat generation.

Further in order to apply a high voltage to the semiconductor device, the breakdown voltage of the semiconductor substrate has to be improved. This may be achieved by increasing the thickness of the semiconductor substrate. However, an amount of the heat generated from the semiconductor substrate is increased exponentially in accordance with the increase in the thickness of the semiconductor substrate. In this manner, when the thickness of the semiconductor substrate is increased, the heat loss increases abruptly. Therefore, it has been generally practiced to increase the breakdown voltage by connecting a plurality of semiconductor elements in series with each other.

FIG. 2 shows such a construction in which two semiconductor elements, e.g. thyristors are provided between the heat sinks 24 and the heat pipes 25 having the cooling fins 26 are inserted into the heat sinks. When a plurality of semiconductor elements are connected in series with each other while they are clamped between the heat sinks, the size of the whole semiconductor device is increased in proportion to the number of the semiconductor elements, so that the whole construction becomes large and the cost including the assembling and maintenance costs is also increased.

SUMMARY OF THE INVENTION

The present invention has for its object to provide a novel and useful power semiconductor device with heat dissipating property, which can avoid the above mentioned drawbacks of the known power semiconductor device and can have an improved heat dissipating property without increasing the size of the whole device.

It is another object of the invention to provide a power semiconductor device which has an improved heat dissipating property and a high breakdown voltage without increasing the size of the whole device.

According to a first aspect of the invention, a power semiconductor device with heat dissipating property comprises:
- a semiconductor element having a semiconductor substrate;
- a first electrically conductive member arranged on one surface of the semiconductor substrate;
- a second electrically conductive member arranged on the other surface of the semiconductor substrate;
- at least one first heat pipe having one end inserted into said first electrically conductive member;
- at least one second heat pipe having one end inserted into said second electrically conductive member;
- a plurality of first cooling fins arranged on said first heat pipe; and
- a plurality of second cooling fins arranged in said second heat pipe.

In this semiconductor device according to the first aspect of the invention, since the heat pipe is directly inserted into the electrically conductive member serving as the heat sink, the heat transmission path length can be shortened, and thus the whole device can be made very small.

According to a second aspect of the present invention, a power semiconductor device with heat dissipating property comprises:
- a semiconductor element having a semiconductor substrate;

an insulating package arranged to hermetically seal the semiconductor substrate to form a space between the semiconductor substrate and said insulating package;

a heat pipe having one end inserted into said insulating package such that an inner space of the heat pipe is communicated with said space within said insulating package;

an electrically insulating cooling medium filled in said spaces formed within the insulating package and heat pipe; and a plurality of cooling fins provided on the heat pipe.

In this power semiconductor device according to the second aspect of the invention, the cooling medium can directly draw the heat generated from the semiconductor substrate, so that the cooling efficiency becomes very high and therefore the heat sink can be made much smaller than the known power semiconductor device.

According to a third aspect of the instant invention, a power semiconductor device with heat dissipating property comprises:

a plurality of semiconductor elements each having a semiconductor substrate, said semiconductor substrates being stacked one on another;

a plurality of heat compensating plates, each of said heat compensating plates being arranged between successive semiconductor substrates;

a first electrically conductive member arranged on one surface of an assembly of said semiconductor substrates and heat compensating plates;

a second electrically conductive member arranged on the other surface of said assembly; and an insulating package in which said assembly is hermetically sealed such that outer surfaces of said first and second conductive members are exposed out of the insulating package.

In this power semiconductor device according to the third aspect of the invention, since a plurality of semiconductor substrates are arranged within the single cap-like package while the temperature compensating plates are inserted between successive semiconductor substrates, the whole device can be made much smaller than the known power semiconductor device in which each semiconductor element is hermetically sealed by its respective insulating package, and a plurality of assemblies each including a semiconductor substrate, temperature compensating plates, and conductive members are stacked one on another.

Furthermore, according to a fourth aspect of the present invention, a power semiconductor device with heat dissipating property comprises:

a plurality of semiconductor elements each having semiconductor substrates, said semiconductor substrates being stacked one on another;

a plurality of temperature compensating plates, each of said temperature compensating plates being arranged between successive semiconductor substrates;

a first electrically conductive member arranged on one surface of an assembly of the semiconductor substrates and temperature compensating plates;

a second electrically conductive member arranged on the other surface of said assembly;

an insulating package in which an assembly of said semiconductor substrates, temperature compensating plates and first and second conductive members being hermetically sealed such that outer surfaces of said first and second conductive members are exposed out of said insulating package;

at least one heat pipe having one end inserted into said insulating package; and a plurality of cooling fins provided on said heat pipe.

In this power semiconductor device according to the fourth aspect of the instant invention, the same advantage as that of the above mentioned power semiconductor device according to the third aspect of the invention can be also obtained, and further the heat generated from the semiconductor substrates within the package can be promptly removed by means of the heat pipe having a plurality of the cooling fins, so that a larger current can flow through the semiconductor device as compared with the power semiconductor device according to the third aspect of the invention.

BRIEF DESCRIPTION OF THE DRAWINGS

FIG. 1 is a cross sectional view showing a known power semiconductor device;

FIG. 2 is a side view illustrating another known power semiconductor device;

FIG. 5 is a cross sectional view depicting an embodiment of the power semiconductor device according to the third aspect of the invention;

FIG. 6 is a cross sectional view depicting a first embodiment of the power semiconductor device according to the fourth aspect of the invention;

FIG. 10 is a cross sectional view depicting a sixth embodiment of the power semiconductor device according to the fourth embodiment of the invention;

FIG. 11 is a cross sectional view depicting a seventh embodiment of the power semiconductor device according to the fourth aspect of the invention;

FIG. 12 is a cross sectional view depicting a modification of the embodiment shown in FIG. 10; and FIG. 13 is a cross sectional view illustrating a modification of the embodiment depicted in FIG. 7.

DETAILED EXPLANATION OF THE PREFERRED EMBODIMENTS

Figure 3:
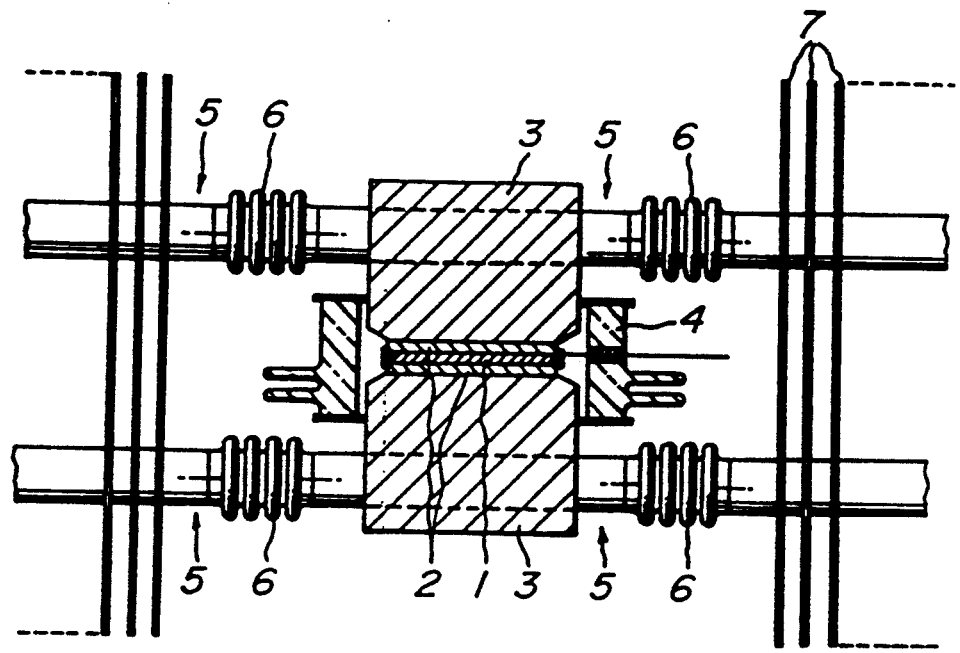
FIG. 3 is a cross sectional view depicting an embodiment of the power semiconductor device according to the first aspect of the invention.

FIG. 3 is a cross sectional view showing an embodiment of the power semiconductor device according to the first aspect of the instant invention. A reference numeral 1 denotes a flat type semiconductor substrate. It should be noted that the semiconductor element of all embodiments is constructed by a power thyristor, but it may be formed by other power semiconductor element such as power transistor and diode. On both sides of the semiconductor substrate 1 are arranged temperature compensating plates 2, and on the outer surfaces of these temperature compensating plates are provided electrically conductive members 3 made of copper. The conductive member 3 serve not only as the electrodes, but also as the heat dissipating sinks. An assembly of the semiconductor substrate 1 and conductive members 3 is hermetically sealed by a cap-like package 4 made of insulating material. In this embodiment, the package 4 is formed by an insulator having a corrugated outer surface. According to the first aspect of the present invention, ends of a pair of first heat pipes 5 are inserted into the first conductive member 3, and similarly ends of a pair of second heat pipes 5 are inserted into the second conductive member 3. To this end, the thickness of the first and second conductive members 3 may be increased to such an extent that the conductive members 3 can accommodate the heat pipes 5. As shown in FIG. 3, the first heat pipes 5 are aligned in a first direction and the second heat pipes are also aligned in a second direction which is parallel with the first direction. It should be noted that these first and second directions are parallel with a plane in which the semiconductor substrate 1 extends. The heat pipes 5 include electrically insulating pipe portions 6 which are formed as an insulator, and the remaining portions of the heat pipes are made of metal. Within the heat pipes 5 cooling medium is filled. On each of metal portions of the heat pipes 5 there are arranged a plurality of cooling fins 7. In the present embodiment, since the heat pipe 5 on the positive side is isolated from the heat pipe 5 on the negative side by means of the insulating pipe portions 6, each of the cooling fins 7 made of metal can be provided both on the heat pipes 5 extending in respective sides of the conductive members 3.

When a large current flows through the substrate 1 of the thyristor via the conductive members 3, a large amount of heat generated by the substrate 1 is effectively transmitted into the heat pipes 5 directly inserted into the conductive members and then is dissipated from the cooling fins 7 provided on the heat pipes. Contrary to this, in the known power semiconductor device the heat generated by the substrate is once transmitted to the conductive members and is then further transmitted to the cooling fins by means of the metal block (FIG. 1) or the heat sink (FIG. 2). That is to say, in the power semiconductor device of the present embodiment, end portions of the heat pipes 5 are directly embedded into the conductive members 3, so that the heat resistance between the conductive members and the cooling fins can be decreased to a great extent. Further the heat is removed from a point near the heat generating point, and thus the heat dissipation can be performed efficiently.

In the present embodiment, the cooling fins 7 are provided such that the two heat pipes 5 are coupled with each other by means of the cooling fins without causing any problem of the short-circuit, because the insulating pipe portions 6 are inserted within the heat pipes, so that the effective surface area of the cooling fins can be increased and the heat dissipating efficiency can be improved. Further it is apparent that the assembling of the cooling fins and heat pipes becomes easy.

Figure 4:
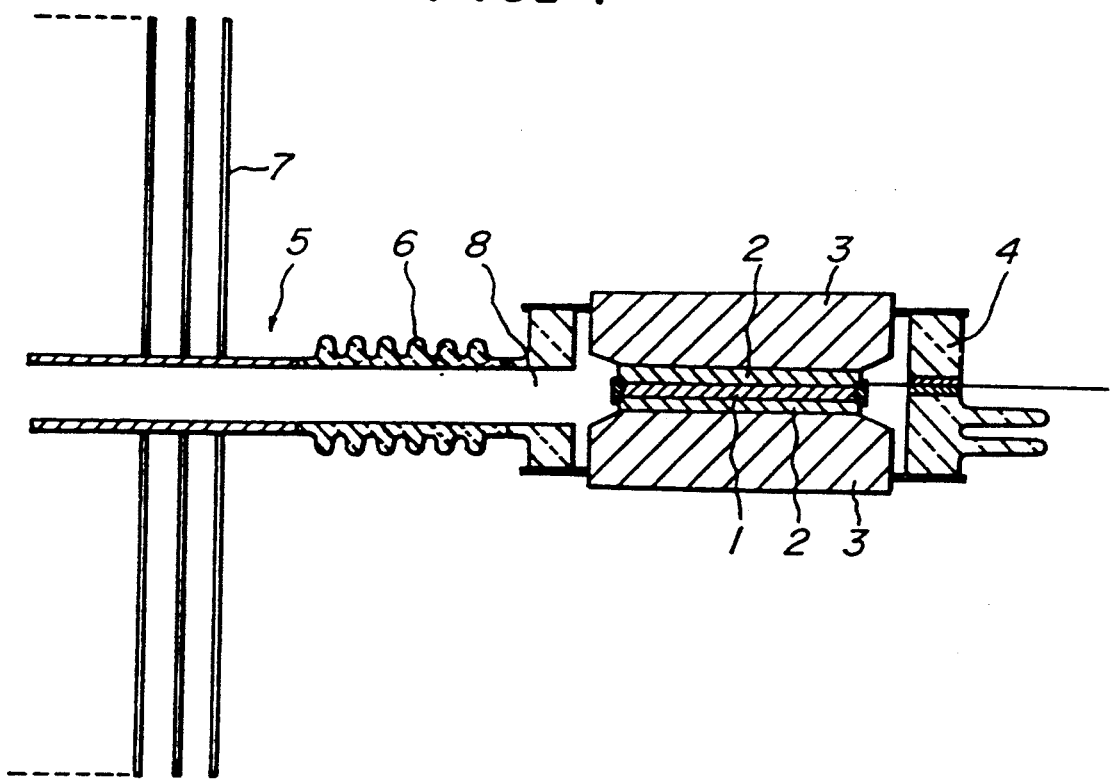
FIG. 4 is a cross sectional view depicting an embodiment of the power semiconductor device according to the second aspect of the invention.

FIG. 4 is a cross sectional view illustrating an embodiment of the power semiconductor device according to the second aspect of the present invention. A semiconductor substrate 1 is clamped between first and second electrically conductive members 3 via first and second temperature compensating plates 2, respectively. The semiconductor substrate 1 is hermetically sealed by an insulating cap-like package 4 such that outer surfaces of the conductive members 3 are exposed out of the package. In the present embodiment, one end of a heat pipe 5 is inserted into the insulating cap-like package 4 such that an inner space of the heat pipe 5 is communicated with a space formed between the package 4 and an assembly of the semiconductor substrate 1, temperature compensating plates 2 and conductive members 3. Therefore, a cooling medium 8 filled within the heat pipe 5 can be directly contacted with the semiconductor substrate 1. In order to avoid a short-circuit, the cooling medium 8 is made of electrically insulating material. The heat pipe 5 includes an insulating pipe portion 6 formed as an insulator having a corrugated outer surface, and a plurality of cooling fins 7 are provided on the remaining metal pipe portion of the heat pipe 5, and thus the short-circuit between the first and second conductive members 3 of positive and negative polarities can be avoided.

In the embodiment of the power semiconductor device according to the invention shown in FIG. 4, a large amount of heat which is generated from the semiconductor substrate 1 when a large current flows therethrough is promptly transmitted to the cooling fins 7 with the aid of the cooling medium 8 which can be directly contacted with the semiconductor substrate, so that heat dissipation is very efficient. It should be noted that the cooling medium 8 is in direct contact with both the first and second conductive members 3 connected to the positive and negative potentials, respectively, but the cooling medium has a highly insulating property, so that there is not caused any trouble such as the short-circuit.

FIG. 5 is a cross sectional view depicting an embodiment of the power semiconductor device according to the third aspect of the invention. In the present embodiment, a plurality of semiconductor substrates 1 are stacked one on another while temperature compensating plates 2 are inserted between successive semiconductor substrates. On both surfaces of the assembly of the semiconductor substrates 1 and temperature compensating plates 2 are provided first and second electrically conductive members 3 serving as the positive and negative electrodes, respectively. Then an assembly of the semiconductor substrates 1, temperature compensating plates 2 and conductive members 3 is hermetically sealed by a package 4 made of insulating material such as ceramics such that outer surfaces of the conductive members 3 are exposed out of the package 4. In the present embodiment, the insulating package 4 is formed by an insulator whose outer surface is shaped in the corrugated form in order to increase the discharge distance along the outer surface to make the breakdown voltage high.

In this power semiconductor device according to the third aspect of the invention, a plurality of the semiconductor substrates 1 and temperature compensating plates 2 are alternately stacked within the package 4, so that it is possible to attain a high breakdown voltage. Further the thickness of each semiconductor substrates 1 can be made small, and thus the heat loss can be decreased upon being compared with the case in which use is made of a single thick semiconductor substrate. Moreover, the assembly of the semiconductor substrates 1, temperature compensating plates 2 and conductive members 3 is sealed by the single package 4, and therefore the whole size of the device can be made much smaller than the known device illustrated in FIG. 2.

FIG. 6 is a cross sectional view representing a first embodiment of the power semiconductor device according to the fourth aspect of the present invention. In the present embodiment, a plurality of semiconductor substrates 1, temperature compensating plates 2 and a pair of conductive members 3 form the same assembly as that of the previous embodiment shown in FIG. 5. The assembly is hermetically sealed by a package 4 made of insulating material. Ends of a plurality of heat pipes 5 are inserted into the package 4 such that the cooling medium filled within the heat pipes can be in direct contact with the semiconductor substrates 1. That is to say, a space surrounded by the assembly of the semiconductor substrates 1, temperature compensating plates 2 and conductive members 3 and the package 4 is communicated with inner spaces within the heat pipes 5. In order to avoid the short-circuit between the semiconductor substrates the cooling medium is made of electrically insulating material. Also in this embodiment, the heat generated by the semiconductor substrates 1 is directly transmitted to the cooling fins 7 by means of the cooling medium, so that heat dissipation can be carried out very efficiently.

Figure 7:
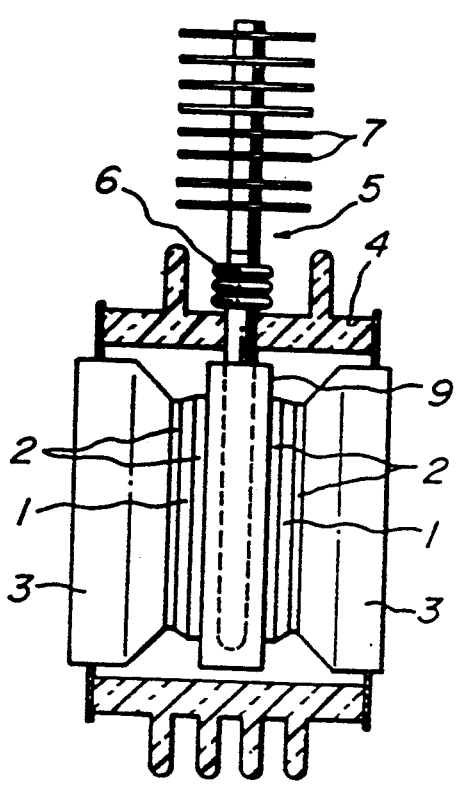
FIG. 7 is a cross sectional view depicting a second embodiment of the power semiconductor device according to the fourth aspect of the invention.

FIG. 7 is a cross sectional view showing a second embodiment of the power semiconductor device according to the fourth aspect of the present invention. In this embodiment, a heat sink 9 made of metal having a high heat transmission such as copper is arranged at a middle of the assembly of semiconductor substrates 1, temperature compensating plates 2 and conductive members 3. Then the assembly including the heat sink 9 is hermetically sealed by an insulating package 4 such that outer surfaces of the conductive members 3 are exposed out of the package, and one end of a heat pipe 5 is inserted into the heat sink 9 via the insulating package 4. The insulating package 4 is formed by an insulator having a corrugated outer surface. The heat pipe 5 includes an insulating pipe portion 6 coupled with the package 4 and a metal pipe portion connected to the insulating pipe portion, and cooling fins 7 provided on the metal pipe portion. In this embodiment, the heat generated by the semiconductor substrates 1 is transmitted to the cooling fins 7 by means of the heat sink 9 and heat pipe 5.

In the embodiment illustrated in FIG. 7, one end of the heat pipe 5 is inserted into the heat sink 9 serving as the central conductive member, but it is also possible to form a hole in the heat sink 9 and the heat pipe is coupled with the insulating package such that an opening of the hole formed in the heat sink is opposed to an opening of an inner space of the heat pipe.

Figure 8:
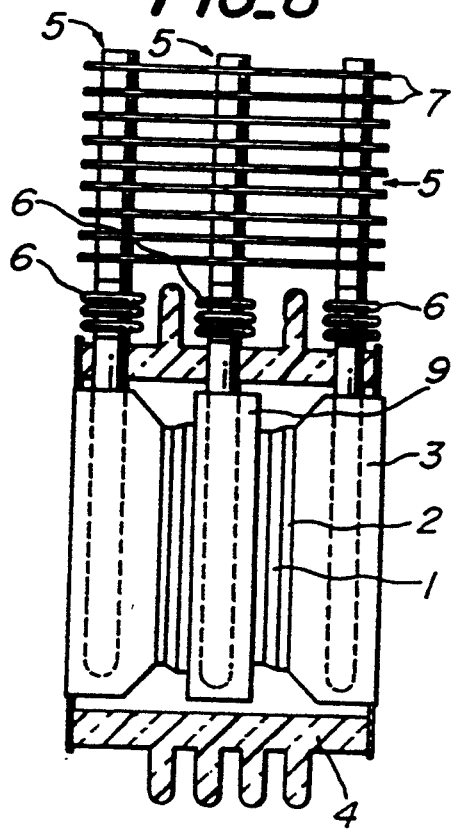
FIG. 8 is a cross sectional view depicting a third embodiment of the power semiconductor device according to the fourth aspect of the invention.

FIG. 8 is a cross sectional view illustrating a third embodiment of the power semiconductor device according to the fourth aspect of the invention. In the present embodiment, in addition to the heat pipe 5 which is inserted into the heat sink 9, there are arranged two further heat pipes 5 whose ends are inserted into the conductive members 3. Therefore, the heat dissipation can be performed much more efficiently as compared with the previous embodiment shown in FIG. 7, so that the whole construction can be made much smaller. Each of the heat pipes 5 is consisting of an insulating pipe portion coupled with the package 4 and a metal pipe portion connected to the insulating pipe portion. The cooling fins 7 are formed by metal plates which are commonly provided on the metal pipe portions of the heat pipes 5.

Figure 9:
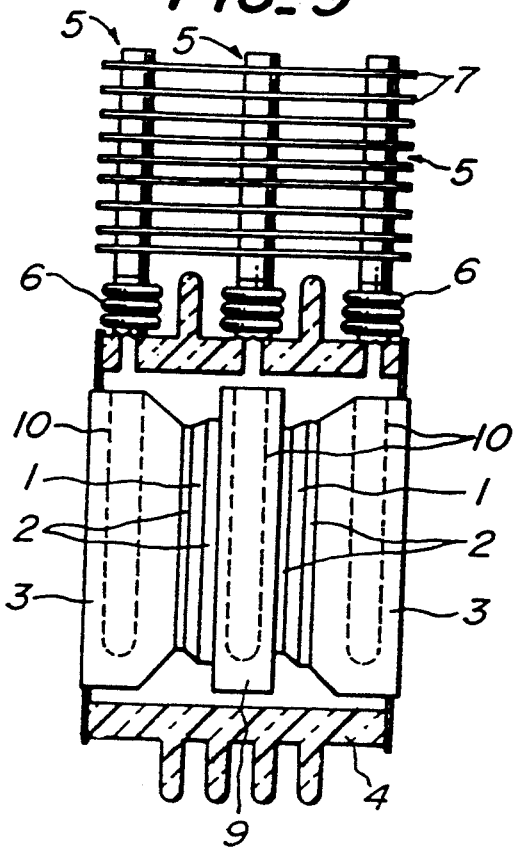
FIG. 9 is a cross sectional view depicting a fourth embodiment of the power semiconductor device according to the fourth aspect of the invention.

FIG. 9 is a cross sectional view depicting a fourth embodiment of the power semiconductor device according to the fourth aspect of the present invention. In this embodiment, the construction of the assembly of semiconductor substrates 1, temperature compensating plates 2 and conductive members 3 is similar to that of the embodiment shown in FIG. 8. In the heat sink 9 and conductive members 3 there are formed holes 10, and openings of heat pipes 5 are exposed into the space formed between an insulating package 4 and the assembly 1, 2, 3. Therefore, the cooling medium filled in the heat pipes 5 can flow into the holes 10, so that the heat can be effectively transmitted to the cooling fins 7 provided on the heat pipes. As shown in FIG. 9, the openings of the holes 10 formed in the heat sink 9 and conductive members 3 are opposed to openings of the inner spaces of the heat pipes 5.

FIG. 10 is a cross sectional view showing a fifth embodiment of the power semiconductor device according to the fourth aspect of the invention. In this embodiment, first and second package halves 4A made of insulating material seals first and second assemblies of semiconductor substrate 1, temperature compensating plates 2 and conductive members 3 independently from each other, while the central conductive member 3 is commonly used for the first and second assemblies. One end of a heat pipe 5 is inserted into this central conductive member 3. It should be noted that the central conductive member 3 also serve as the heat sink. The heat pipe 5 includes an insulating pipe portion 6 and a metal pipe portion, and a plurality of cooling fins 7 are provided on the metal pipe portion. In the present embodiment, the semiconductor substrates 1 are sealed by the package halves 4A independently from each other, so that the assembling operation becomes much easy and the manufacturing cost can be further reduced.

FIG. 11 is a cross sectional view illustrating a sixth embodiment of the power semiconductor device according to the fourth aspect of the present invention. In this embodiment, in addition to the heat pipe 5 inserted into the central conductive member 3 there are provided two further heat pipes 5 whose one ends are inserted into the outermost conductive members 3, respectively. Therefore, heat dissipation can be performed much more efficiently than the embodiment depicted in FIG. 10. The heat pipes 5 include the insulating pipe portions 6, so that the cooling fins 7 are formed by metal plates which are commonly provided on the heat pipes.

FIG. 12 is a cross sectional view showing a first modification of the fifth embodiment shown in FIG. 10. In this modified embodiment, on outer surfaces of the outermost conductive members 3 are arranged outermost heat sinks 9A and the outermost heat pipes 5 are inserted into these outermost heat sinks instead of the outermost conductive members. Furthermore, on each heat pipes 5, the cooling fins 7 are provided independently from each other.

FIG. 13 is a cross sectional view illustrating a modification of the embodiment of the power semiconductor device shown in FIG. 7. In this modification, on outer surfaces of the outermost conductive members 3 are arranged outermost heat sinks 9A and the outermost heat pipes 5 are inserted into these heat sinks instead of the outermost conductive members. Also, the cooling fins 7 are provided on each of the heat pipes 5 independently from each other.

In the modified embodiments illustrated in FIGS. 12 and 13, the heat dissipation can be carried out much more efficiently due to the heat sinks 9A.

As explained above in detail, according to the first and second aspects of the present invention, the heat resistance between the semiconductor substrate and the heat sink can be removed, so that the heat generated by the semiconductor substrate can be dissipated efficiently and a large current can flow through the semiconductor substrate. When the current capacity is limited, the whole construction can be made very small.

According to the third aspect of the present invention, since a plurality of semiconductor substrates are sealed within the single package, it is possible to obtain the semiconductor device having a high breakdown voltage without increasing the size of the whole device.

Further, according to the fourth aspect of the invention, since one or more heat pipes are inserted into the package, the heat dissipation can be realized much more efficiently, so that a larger current can flow through the semiconductor substrates.

It should be noted that in all the embodiments so far explained the semiconductor element is formed as the thyristor, but it may be constructed by other semiconductor element such as diode and transistor.

What is claimed is:

1. A power semiconductor device comprising:
   a semiconductor substrate;
   a first electrode coupled to one surface of the semiconductor substrate by a first temperature compensating plate arranged between said first electrode and the semiconductor substrate;
   a second electrode coupled to the other surface of the semiconductor substrate by a second temperature compensating plate arranged between said second electrode and the semiconductor substrate;
   at lest one first heat pipe having an insulating pipe portion and a metal pipe portion, and having one end inserted into said first electrode;
   at least one second heat pipe having an insulating pipe portion and a metal pipe portion, and having one end inserted into said second electrode;
   a plurality of cooling fins arranged along said metal pipe portions of said first and second heat pipes thereby connecting said first and second heat pipes, wherein the semiconductor substrate and said first and second temperature compensating plates form an assembly; and
   an insulating package directly fixed to said first and second electrodes to hermetically seal said assembly and a portion of said first and second electrodes, wherein said first and electrodes protrude from said insulating package to receive said first and second heat pipes.

2. A power semiconductor device according to claim 1, wherein two first heat pipes are inserted into said first electrode such that these first heat pipes are aligned with each other in a first direction, and two second heat pipes are inserted into said second electrode such that these second heat pipes are aligned with each other in a second direction which is parallel with the first direction.

3. A power semiconductor device according to claim 2, wherein said first and second directions are parallel with a plane in which said semiconductor substrate extends.

4. A power semiconductor device according to claim 1, wherein said insulating package is formed by an insulator having a corrugated outer surface.

5. A power semiconductor device comprising:
   a semiconductor substrate;
   first and second temperature compensating plates arranged on opposite sides of said semiconductor substrate;
   first and second electrodes arranged on said first and second temperature compensating plates, respectively;
   an insulating package hermetically sealing the semiconductor substrate, said first and second temperature compensating plates and a portion of said first and second electrodes such that a space is formed between the semiconductor substrate and the insulating package, said insulating package being directly fixed to said first and second electrodes such that outer surfaces of said first and second electrodes are exposed out of said insulating package;
   a heat pipe having one end inserted into said insulating package such that an inner space of the heat pipe is communicated with said space, said heat pipe comprising an insulating pipe portion and a metal pipe portion extending from said insulating pipe portion, said insulating pipe portion having a first end coupled to the insulating package, and a second end, opposite said first end, coupled to said metal pipe portion;
   an electrically insulating cooling medium filled in said spaces formed within the insulating package and heat pipe; and
   a plurality of cooling fins provided along said metal pipe portion of the heat pipe.

6. A power semiconductor device according to claim 5, wherein said insulating pipe portion is formed by an insulator having a corrugated outer surface.

7. A power semiconductor device comprising:
   a plurality of semiconductor substrates, said semiconductor substrates being stacked one on another;
   a plurality of temperature compensating plates, each of said temperature compensating plates being arranged between successive semiconductor substrates, said plurality of semiconductor substrates and plurality of temperature compensating plates forming an assembly;
   a first electrode arranged on one surface of said assembly, wherein said one surface is defined by an outer surface of one of said plurality of temperature compensating plates;
   a second electrode arranged on an opposite surface of said assembly, wherein said opposite surface is defined by an outer surface of another of said plurality of temperature compensating plates;
   an insulating package fixed directly to the first and second electrodes and in which said assembly is hermetically sealed such that outer surfaces of said first and second electrodes are exposed out of said insulating package and a space is formed between the insulating package and the assembly;
   at least one heat pipe comprising an insulating pipe portion and a metal pipe portion extending from a first end of said insulating pipe portion, wherein a second end, opposite said first end, of said insulating pipe portion is inserted into said insulating package, such that said heat pipe is open to said space;

an insulating cooling medium filled within said space and within said heat pipe; and a plurality of cooling fins provided along said metal pipe portion of said heat pipe.

8. A power semiconductor device according to claim 7, wherein said insulating package is formed by an insulator having a corrugated outer surface.

9. A power semiconductor device according to claim 7, further comprising a heat sink arranged at a middle of said assembly of the semiconductor substrates and temperature compensating plates and having a hole formed therein, an opening of said hole being opposed to an opening of an inner space of a first said heat pipe.

10. A power semiconductor device according to claim 9, wherein each of said first and second electrodes each has a hole formed therein, and the device further comprises a second said heat pipe arranged such that an opening of an inner space of the second said heat pipe is opposed to an opening of the hole formed in the first electrode, and a third said heat pipe arranged such that an opening of an inner space of the third said heat pipe is opposed to an opening of the hole formed in the second electrode.

11. A power semiconductor device according to claim 10, wherein said first, second and third heat pipes are extended from the same side of the insulating package in the same direction, each of said first, second and third heat pipes includes an insulating pipe portion and a metal pipe portion, and said cooling fins provided on these heat pipes are commonly formed by cooling fins which are coupled with the metal pipe portions of the first, second and third heat pipes.

* * * * *